(12) United States Patent
Provencher et al.

(10) Patent No.: US 7,918,938 B2
(45) Date of Patent: Apr. 5, 2011

(54) HIGH TEMPERATURE ALD INLET MANIFOLD

(75) Inventors: Timothy J. Provencher, Gilbert, AZ (US); Craig B. Hickson, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 904 days.

(21) Appl. No.: 11/654,372

(22) Filed: Jan. 17, 2007

(65) Prior Publication Data

US 2008/0202416 A1 Aug. 28, 2008

Related U.S. Application Data

(60) Provisional application No. 60/760,243, filed on Jan. 19, 2006.

(51) Int. Cl.
*C23C 16/00* (2006.01)
*C23C 16/455* (2006.01)

(52) U.S. Cl. .............. 118/715; 156/345.29; 156/345.33; 156/345.34

(58) Field of Classification Search .................. 118/715; 156/345.29, 345.33, 345.34
See application file for complete search history.

(56) References Cited

U.S. PATENT DOCUMENTS

| | | | |
|---|---|---|---|
| 4,747,367 A * | 5/1988 | Posa | 118/715 |
| 4,828,224 A | 5/1989 | Crabb et al. | |
| 4,889,609 A | 12/1989 | Cannella | |
| 4,895,107 A | 1/1990 | Yano et al. | |
| 4,907,534 A | 3/1990 | Huang et al. | |
| 4,949,783 A | 8/1990 | Lakios et al. | |
| 4,951,601 A | 8/1990 | Maydan et al. | |
| 4,990,047 A | 2/1991 | Wagner et al. | |
| 5,071,460 A | 12/1991 | Fujiura et al. | |
| 5,080,549 A | 1/1992 | Goodwin et al. | |
| 5,121,705 A | 6/1992 | Sugino | |
| 5,166,092 A | 11/1992 | Mochizuki et al. | |
| 5,186,718 A | 2/1993 | Tepman et al. | |
| 5,192,371 A | 3/1993 | Shuto et al. | |
| 5,199,483 A | 4/1993 | Bahng | |
| 5,217,501 A | 6/1993 | Fuse et al. | |
| 5,223,001 A | 6/1993 | Saeki | |
| 5,229,615 A | 7/1993 | Brune et al. | |
| 5,248,253 A | 9/1993 | Culley et al. | |
| 5,284,519 A | 2/1994 | Gadgil | |
| 5,286,296 A | 2/1994 | Sato et al. | |
| 5,288,327 A | 2/1994 | Bhat et al. | |
| 5,350,453 A | 9/1994 | Schlosser | |
| 5,388,944 A | 2/1995 | Takanabe et al. | |
| 5,391,035 A | 2/1995 | Krueger | |
| 5,433,785 A | 7/1995 | Saito | |

(Continued)

FOREIGN PATENT DOCUMENTS

DE 3715644 1/1988

(Continued)

*Primary Examiner* — Jeffrie R Lund
(74) *Attorney, Agent, or Firm* — Knobbe Martens Olson & Bear LLP

(57) ABSTRACT

A system and method for distributing one or more gases to an atomic layer deposition (ALD) reactor. An integrated inlet manifold block mounted over a showerhead assembly includes high temperature (up to 200° C.) rated valves mounted directly thereto, and short, easily purged reactant lines. Integral passageways and metal seals avoid o-rings and attendant dead zones along flow paths. The manifold includes an internal inert gas channel for purging reactant lines within the block inlet manifold

12 Claims, 8 Drawing Sheets

U.S. PATENT DOCUMENTS

| | | | | |
|---|---|---|---|---|
| 5,462,397 | A | 10/1995 | Iwabuchi | |
| 5,488,925 | A * | 2/1996 | Kumada | 118/715 |
| 5,516,732 | A | 5/1996 | Flegal | |
| 5,520,742 | A | 5/1996 | Ohkase | |
| 5,520,743 | A | 5/1996 | Takahashi | |
| 5,538,390 | A | 7/1996 | Salzman | |
| 5,571,330 | A | 11/1996 | Kyogoku | |
| 5,586,585 | A | 12/1996 | Bonora et al. | |
| 5,601,651 | A | 2/1997 | Watabe | |
| 5,609,459 | A | 3/1997 | Muka | |
| 5,728,223 | A | 3/1998 | Murakami et al. | |
| 5,755,878 | A | 5/1998 | Habuka et al. | |
| 5,789,027 | A | 8/1998 | Watkins et al. | |
| 5,938,840 | A | 8/1999 | Habuka et al. | |
| 6,070,550 | A | 6/2000 | Ravi et al. | |
| 6,079,353 | A | 6/2000 | Leksell et al. | |
| 6,114,227 | A | 9/2000 | Leksell et al. | |
| 6,224,676 | B1 * | 5/2001 | Nakajima et al. | 118/707 |
| 6,303,501 | B1 | 10/2001 | Chen et al. | |
| 6,846,516 | B2 * | 1/2005 | Yang et al. | 427/255.32 |
| 6,899,507 | B2 | 5/2005 | Yamagishi et al. | |
| 6,916,398 | B2 | 7/2005 | Chen et al. | |
| 7,021,881 | B2 | 4/2006 | Yamagishi et al. | |
| 7,175,713 | B2 * | 2/2007 | Thakur et al. | 118/715 |
| 7,408,225 | B2 | 8/2008 | Shinriki et al. | |
| 2001/0003015 | A1 | 6/2001 | Chang et al. | |
| 2001/0006093 | A1 | 7/2001 | Tabuchi et al. | |
| 2002/0007790 | A1 | 1/2002 | Park | |
| 2002/0072164 | A1 | 6/2002 | Umotoy et al. | |
| 2002/0081381 | A1 | 6/2002 | DelaRosa et al. | |
| 2003/0056720 | A1 | 3/2003 | Dauelsberg et al. | |
| 2003/0106643 | A1 | 6/2003 | Tabuchi et al. | |
| 2003/0172872 | A1 * | 9/2003 | Thakur et al. | 118/715 |
| 2005/0092247 | A1 | 5/2005 | Schmidt et al. | |
| 2005/0208217 | A1 * | 9/2005 | Shinriki et al. | 427/248.1 |
| 2005/0263197 | A1 | 12/2005 | Eidsmore | |
| 2007/0095285 | A1 * | 5/2007 | Thakur et al. | 118/715 |
| 2007/0128864 | A1 * | 6/2007 | Ma et al. | 438/680 |
| 2007/0194470 | A1 * | 8/2007 | Dedontney | 261/76 |
| 2008/0202416 | A1 * | 8/2008 | Provencher et al. | 118/715 |

FOREIGN PATENT DOCUMENTS

| | | |
|---|---|---|
| DE | 3715644 | 12/1988 |
| WO | WO 90/10092 | 9/1990 |
| WO | WO 01/29282 A2 | 4/2001 |

* cited by examiner

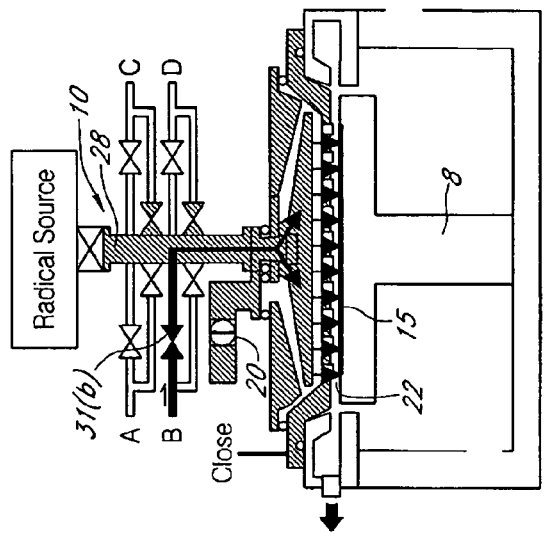
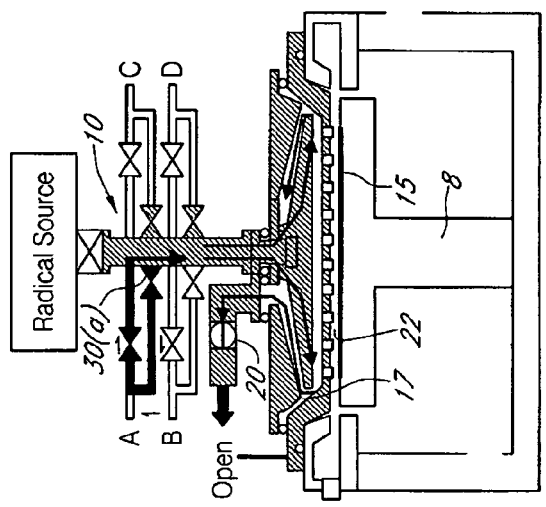
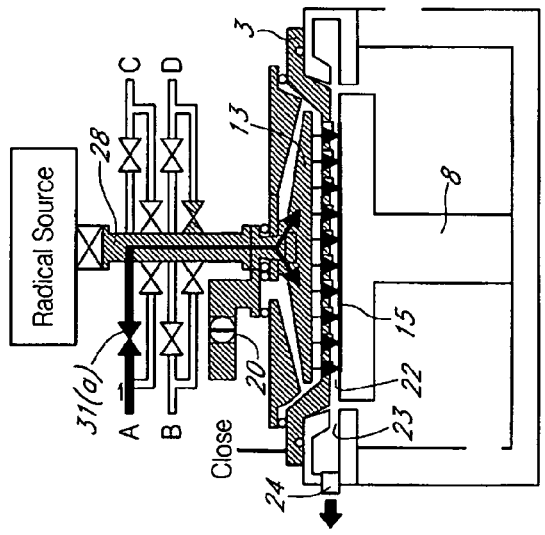
FIG. 3

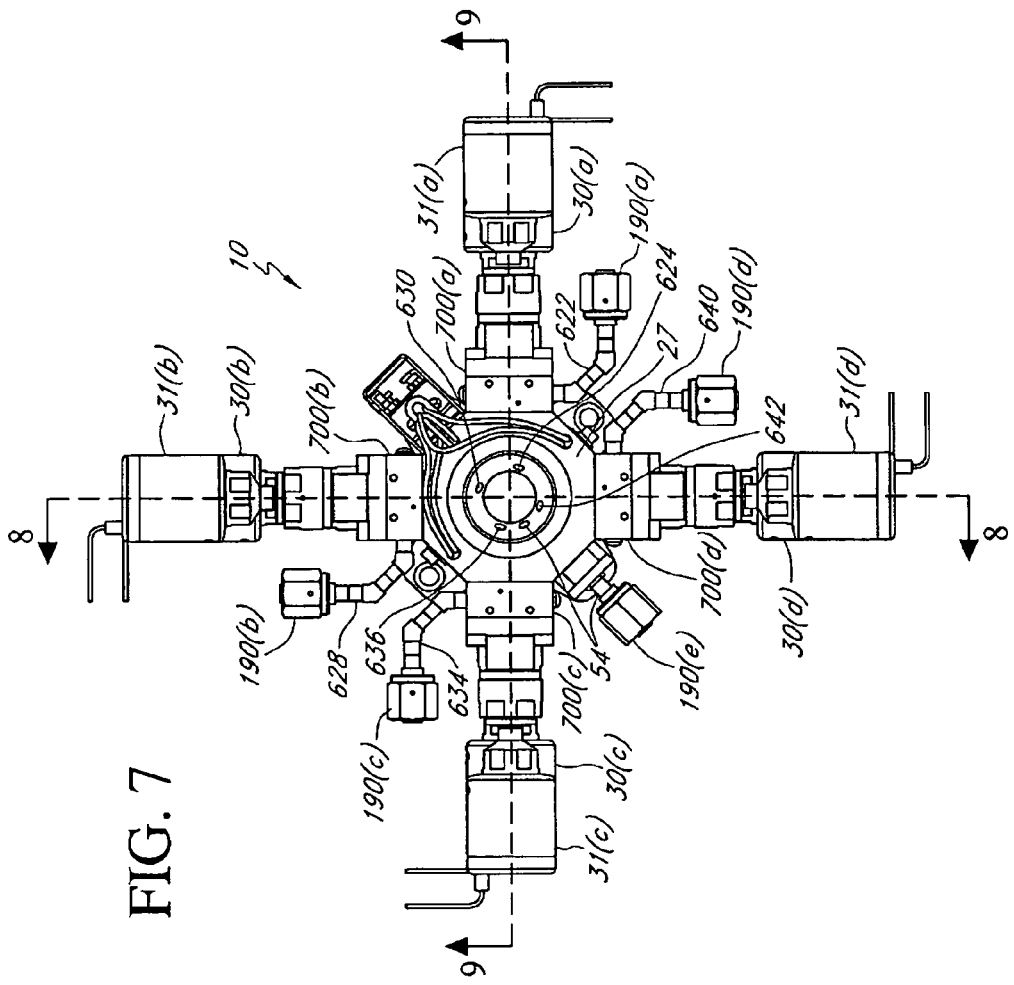

HIGH TEMPERATURE ALD INLET MANIFOLD

RELATED APPLICATIONS

This application claims priority to Provisional Application No. 60/760,243, entitled HIGH TEMPERATURE ALD INLET MANIFOLD, filed on Jan. 19, 2006. The subject matter of the aforementioned application is hereby incorporated herein by reference in its entirety.

BACKGROUND OF THE INVENTION

1. Field of the Invention

The present invention generally relates to a manifold assembly for an atomic layer deposition (ALD) reactor.

2. Description of the Related Art

Atomic layer deposition (ALD) is a well known process in the semiconductor industry for forming thin films of materials on substrates such as silicon wafers. ALD is a type of vapor deposition wherein a film is built up through deposition of multiple ultra-thin layers with the thickness of the film being determined by the number of layers deposited. In an ALD process, gaseous molecules of one or more compounds (precursors) of the material to be deposited are supplied to the substrate or wafer to form a thin film of that material on the wafer. In one pulse, typically less than 1 monolayer of a first precursor material is adsorbed largely intact in a self-limiting process on the wafer. The adsorbed precursor material may be decomposed or otherwise reacted in a subsequent reactant pulse or pulses to form a single molecular layer of the desired material. For example, the adsorbed precursor material may react with the reactant of a subsequent reactant pulse to form a single molecular layer of an element or a compound. Examples include reactant pulses that merely strip ligands from the adsorbed species, reactants that replace ligands with other species to form compounds, and sequences with three or more reactant and/or precursor pulses per cycle. Thicker films are produced through repeated growth cycles until the target thickness is achieved.

In an ALD process, one or more substrates with at least one surface to be coated are introduced into the reactor or deposition chamber. The wafer is typically heated to a desired temperature above the condensation temperature but below the thermal decomposition temperature of the selected vapor phase reactants. One reactant is capable of reacting with the adsorbed species of a prior reactant to form a desired product on the substrate surface. The product can be in the form of a film, liner, or layer.

During an ALD process, the reactant pulses, all of which are typically in vapor or gaseous form, are pulsed sequentially into the reactor with removal steps between reactant pulses. For example, inert gas pulses are provided between the pulses of reactants. The inert gas purges the chamber of one reactant pulse before the next reactant pulse to avoid gas phase mixing or CVD type reactions. A characteristic feature of ALD is that each reactant (whether a precursor contributing species to the film or merely a reducing agent) is delivered to the substrate until a saturated surface condition is reached. The cycles are repeated to form an atomic layer of the desired thickness. To obtain a self-limiting growth, sufficient amount of each precursor is provided to saturate the substrate. As the growth rate is self-limiting, the rate of growth is proportional to the repetition rate of the reaction sequences, rather than to the flux of reactant and/or temperature as in CVD.

SUMMARY OF THE INVENTION

The systems and methods of the present invention have several features, no single one of which are solely responsible for its desirable attributes. Without limiting the scope of this invention as expressed by the claims which follow, its more prominent features will now be discussed briefly. After considering this discussion, and particularly after reading the section entitled "Detailed Description of the Preferred Embodiments," one will understand how the features described herein provide several advantages over traditional ALD mixing methods and systems.

One aspect is an atomic layer deposition device. The device comprises a manifold body having a first passageway and a second passageway, the first passageway and the second passageway having no o-rings. The device further comprises a bore located within the body and in flow communication with the first passageway and the second passageway. The device also comprises a vapor deposition chamber in flow communication with the bore and configured to deposit a thin film on a wafer mounted therein.

Another aspect is a multi-piece manifold assembly for a semiconductor processing device. The manifold assembly comprises a body comprising a first metallic material and having a bore and a base plate comprising the first metallic material and being coupled to the body. The assembly further comprises a cap comprising a second metallic material and being bonded to the base plate, the cap being configured to mount a valve thereon. The assembly also comprises an internal passage formed between the bore of the body and the cap. At least a portion of the internal passage extends through the body and the base plate without forming dead legs at a bond interface between the body and base plate.

Another aspect is an atomic layer deposition device that comprises a dispersion assembly configured to disperse gas and an inlet manifold block mounted over the dispersion assembly and having a bore, a first internal reactant line, and a second internal reactant line, the first and second internal reactant lines being in flow communication with the bore. The assembly further comprises a first reactant valve mounted on the inlet manifold block and configured to control a supply of a first reactant gas to the first internal reactant line and an inert gas valve mounted on the inlet manifold block and configured to control a supply of an inert gas to the first reactant gas valve. The assembly further comprises a second reactant valve coupled to the inlet manifold block and configured to control a supply of a second reactant gas to the second internal reactant line and a second inert gas valve mounted on the inlet manifold block and configured to control a supply of the inert gas to the second reactant gas valve.

Still another aspect is a method of distributing gases to an atomic layer deposition device having a manifold and a reactor. The method comprises routing a first reactant gas to the manifold via a first passageway having no o-rings between a first reactant valve and a manifold outlet, inhibiting the reactant gas flow, and routing an inert gas to the manifold through a second passageway upstream of the first passageway, the second passageway having no o-rings between a first inert gas valve and the first passageway.

BRIEF DESCRIPTION OF THE DRAWINGS

These and other features, aspects and advantages of the present invention will now be described with reference to the drawings of several preferred embodiments, which embodiments are intended to illustrate and not to limit the invention.

FIG. 3 is a schematic drawing showing one example of thin-film formation steps according to an embodiment.

FIG. 7 is a top view of the manifold assembly from FIG. 5.

FIG. 8 is a cross-sectional view taken along lines 8-8 of FIG. 7.

DETAILED DESCRIPTION OF THE PREFERRED EMBODIMENTS

Figure 2:
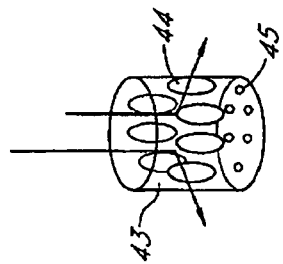
FIG. 2 is a schematic drawing showing one example of an intermediate dispersion element applicable to the apparatus according to an embodiment of the present invention.

Aspects and advantages of the present invention will now be described with reference to the drawings of several preferred embodiments, which embodiments are intended to illustrate and not to limit the invention. Certain embodiments of a manifold body have one or more features. These features include an internal inert gas channel, an integral heater, no o-rings or dead zones within the precursor path, and short reactant gas passageways.

Despite the fact that ALD is prized for self-limiting reactions and thus theoretically perfectly conformal depositions without perfectly uniform conditions, various process parameters must be carefully controlled to ensure a high quality of layers resulting from ALD. It has been found that if the reactant gases are not efficiently purged, it can lead to one precursor being present when the other precursor is pulsing, leading to CVD reactions in the gas phase or on chamber/substrate surfaces instead of surface ALD reactions. Purging of the reactant gases is further complicated by the use of o-rings to assemble subcomponents of the ALD device. These o-rings create small voids commonly referred to as dead legs near the o-ring sealing surface and the gas orifice supplying the precursor. Improper evacuation of these precursors due to trapped volumes in these voids will cause particles, thus negatively impacting the ALD process. These o-rings can also be the source of leaks, either through breach of the sealing surface itself or via permeability of the o-ring material selected for high temperature and chemistry compatibility.

It is important to maintain thermal control of the precursor gas from the source (most likely a vessel carrying a solid precursor) to the wafer surface. There is usually a small window of thermal tolerance allowed (each precursor is different, but they follow the same principal). That is, by controlling thermal aspects of the solid media, vapor draw (or the amount of precursor) is managed. When the temperature is below critical set points, condensation to gas flow paths occurs causing negative process results and short maintenance intervals. When the temperature is above critical set points, "decomposition" of the media occurs and the process is in jeopardy. It is important to keep all the zones as short as possible to maintain better thermal stability.

If the manifold assembly has no thermal integration or control, the temperatures of the mixing gases may vary within the manifold assembly and lead to CVD growth. While the addition of thermal integration to the manifold assembly may inhibit undesirable CVD reactions, it may have a detrimental impact on sub-components of the manifold assembly, for example, the high speed valves. The high speed valves may not be rated for operation in an elevated temperature environment. Furthermore, dead zones along the flow path can cause the reactant gases to re-circulate upstream of the deposition chamber.

The times required to evacuate the precursor are of great importance during the ALD process. The ALD process is a "rapid fire" of precursors and purge gases. The shorter the lines and better the conductance (pumping efficiency), the shorter the process time. This is paramount to the ALD market.

Figure 1:
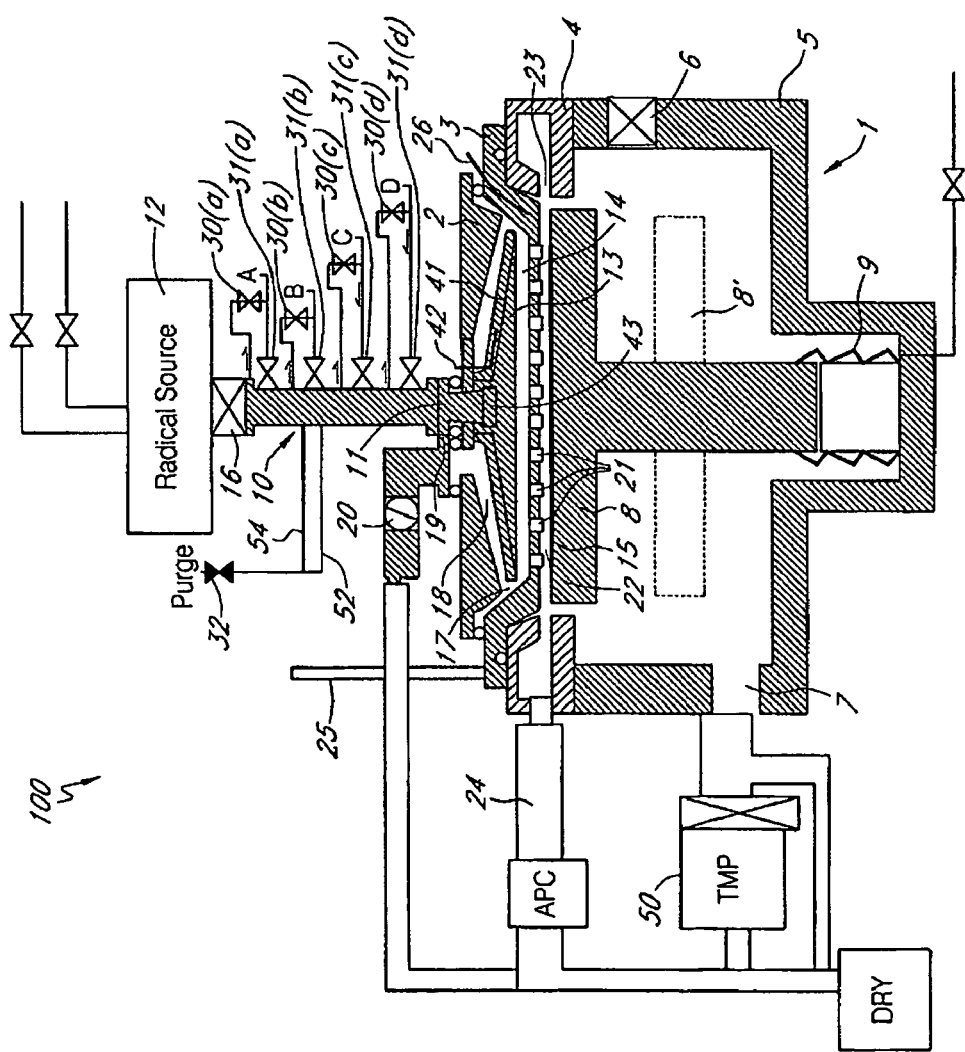
FIG. 1 is a schematic view showing an atomic layer deposition (ALD) device according to an embodiment of the present invention.

FIG. 1 shows a cross section of one embodiment of the thin-film formation apparatus 100 according to an embodiment of the present invention. The thin-film deposition apparatus 100 includes robotics (not shown) that convey a semiconductor substrate 15, which is a work piece or object to be treated, from a vacuum transfer chamber (not shown) to a reaction chamber 1 via a gate valve 6. The reaction chamber 1 comprises an upper lid 2, a dispersion plate 3 (a.k.a. "showerhead plate"), an exhaust duct 4, a lower chamber 5, the substrate-transfer gate valve 6, an exhaust port 7, a substrate support 8, and an elevator mechanism 9 for moving the substrate support 8 up and down.

The substrate 15 is loaded onto the substrate support 8 while the support 8 is in a lowered position 8'. The substrate support 8 is then moved upwards until the semiconductor substrate 15 is positioned at an appropriate distance from the dispersion plate 3. The support 8 is located within the device and is configured to support the substrate 15 or wafer during the deposition process. The support 8 may also be provided with internal or external heaters (not shown) to heat the substrate 15 before and during processing. After the substrate 15 is transferred from the vacuum transfer chamber to the reaction chamber 1, the thin-film deposition apparatus performs a thin-film formation process in the reaction space 22 by cycling, for example, reactant gases via valves 31(a), 31(b), 31(c), and 31(d) and inert gases via valves 30(a), 30(b), 30(c), and 30(d).

In certain embodiments, each reactant gas valve 31(a)-(d) is in flow communication and associated with an inert gas valve 30(a)-(d). Preferably, at least a portion of each reactant gas line is arranged in series with the associated inert gas valve 30. In this way, the inert gas enters the flow path of the reactant gas preferably near, but upstream from, the associated reactant valve 31 to enhance purging of the entire reactant gas line.

For example, each reactant gas valve 31(a)-(d) may be a three port valve. The three port valve has two input ports in flow communication with the reactant gas source and the inert gas valve. The output port of the three port valve is in flow communication with the reaction space 22. The reactant gas valves 31(a)-(d) separately control flow of the reactant gases and the inert gases into the reaction space 22.

In certain embodiments, each inert gas valve 30(a)-(d) is a two port valve. The two port valve has one input port in flow communication with an internal inert gas channel 610 (FIG. 4) and an output port in flow communication with one of the reactant gas valves 31(a)-(d). The two port valve controls flow of the inert gas between the internal inert gas channel 610 and an associated one of the reactant gas valves 31(a)-(d). In this exemplary arrangement, the reactant gas valve 31(a)-(d)

is located in series with and downstream of the associated inert gas valve 30(a)-(d). For gases flowing towards the reaction space 22, a first location is downstream from a second location if gas at the second location flows towards the first location during substrate processing.

Each inert gas valve 30(a)-(d) controls the flow of inert gas to the associated reactant gas valve 31(a)-(d). The reactant gas valve 31(a)-(d) controls the flow of the inert gas received from the associated inert gas valve 30(a)-(d) for purging the reactant vapor line after pulsing the reactant. For example, the inert gas source(s) associated with the reactant vapor sources connected to valves 31(a), 31(b), 31(c), and 31(d) are connected to valves 30(a), 30(b), 30(c), and 30(d), respectively. These inert gas source(s) can be pressurized or not. These inert gas sources can be, for example, noble or nitrogen gas sources. The ALD control system (not shown) includes memory and processing modules, and is programmed to control these valves and other valves to selectively allow or prevent the various gases from reaching the reaction space 22. For example, the flow from an inert gas valve 30 enters the associated reactant gas line and may continue into the reaction chamber 1 and purge the chamber of the reactant gas.

Figure 6:
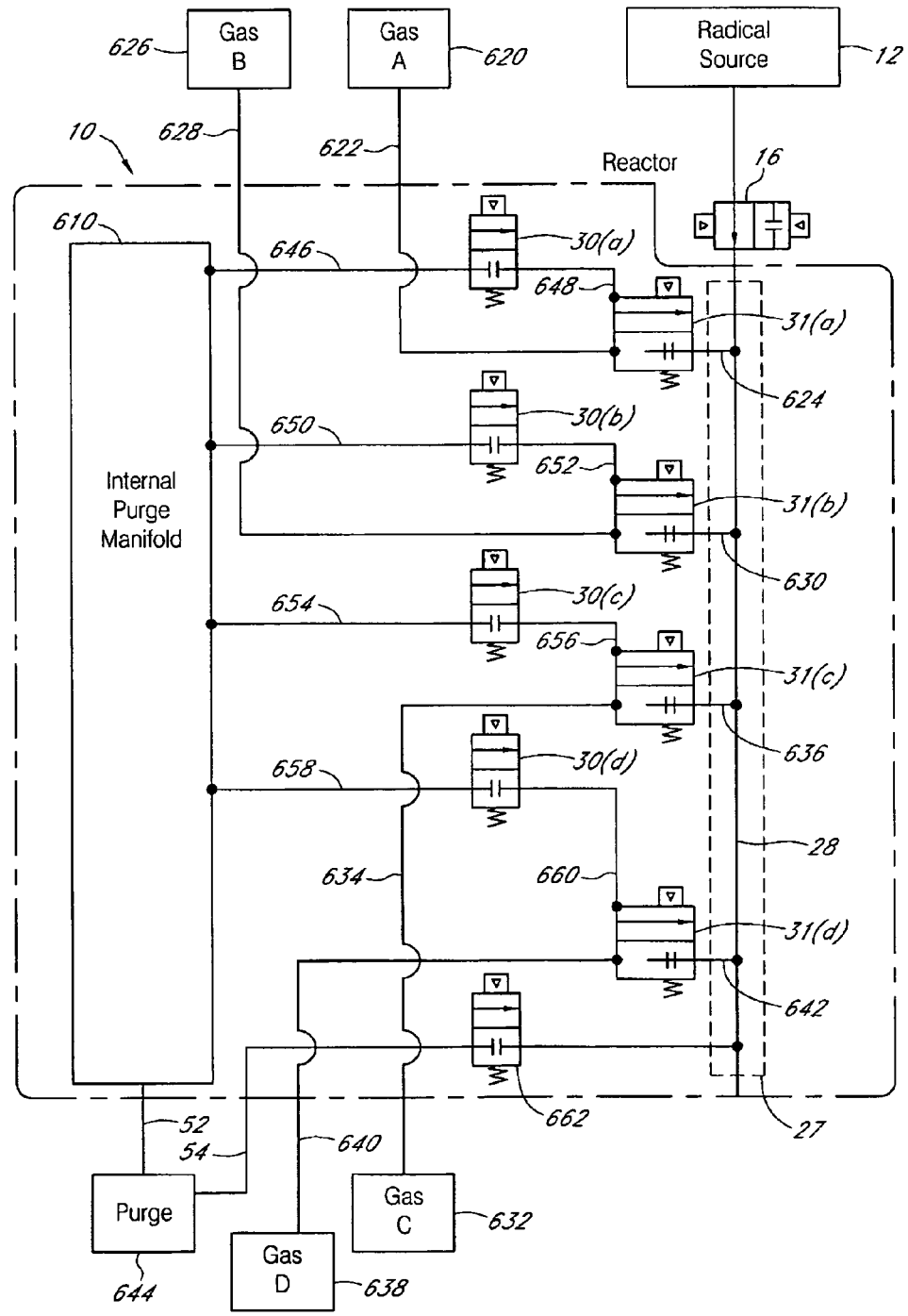
FIG. 6 is a schematic view of gas flow paths through the manifold assembly from FIG. 5 according to an embodiment and shows four inert gas valves, each in flow communication with a separate reactant gas valve.

In addition to the valves 30, 31 associated with the inert gases and the reactant gases, the ALD device may include a separate inert gas line 54 and valve 32 connecting an inert gas source to the reaction chamber 1. Inert gas valve 32 provides additional inert gas to the ALD device and may be operated continuously or on a periodic basis depending on the desired substrate processing. In the illustrated embodiment, inert gas also flows to the internal inert gas channel 610 via the inert channel supply line 52 (FIG. 6). The inert channel supply line 52 may receive inert gas via the inert gas valve 32 or a separate inert gas valve (not shown). The internal inert gas channel 610 is in flow communication with the inert gas valves 30(a)-(d).

The ALD device 100 is configured to deposit a thin film on the substrate 15 when the substrate 15 is inserted in the reaction chamber 1. In general, the ALD device receives a first reactant gas via one or more of the valves 31(a), 31(b), 31(c), 31(d). The ALD device 100 also receives inert gas via one or more of the other valves 30(a), 30(b), 30(c), 30(d). By switching the appropriate valves, the flow of the first reactant gas is stopped and the deposition chamber and the gas lines are then purged with the inert gas from one or more valves 30(a), 30(b), 30(c), 30(d), along with the main purge flow from the inert gas line 54. After the reaction chamber 1 and gas lines are purged, the deposition cycle is continued with one or more of the other reactant gases. The reactants from alternated pulses react with each other only on the substrate or wafer surface to form no more than a single monolayer of the desired product in each cycle and do not react or meet in the gas phase. It should be noted that in some operational modes an increased deposition speed above one monolayer per cycle can be achieved with some sacrifice to uniformity.

In embodiments of the ALD device 100, two or more reactant gases are sequentially flowed (separated by periods of purging) through the ALD device 100 in each cycle to form materials on the wafer. Excess of each reactant gas in the reaction space is subsequently exhausted via an exhaust pipe 24 after adsorbing or reacting in the reaction space 22. The exhaust pipe 24 may be connected to a turbo molecular pump (TMP) 50 to assist in the removal of the gases from the reaction chamber 1 and provide a low pressure condition in the reaction chamber 1. Furthermore, the entire ALD device 100 can be pumped down to a low pressure by connecting any of the couplings on the bottom of the ALD device 100 to a vacuum pump (TMP 50 or dry pump (DRY).

The ALD device 100 includes a gas introduction manifold assembly 10. The manifold assembly 10 includes a body 27 (FIG. 5), the internal inert gas channel 610, and a central bore 28. The manifold assembly 10 further includes one or more of the reactant gas valves 31(a), 31(b), 31(c), 31(d), one or more of the inert gas valves 30(a), 30(b), 30(c), 30(d). The manifold assembly 10 is configured to route reactant gases entering via the reactant valves 31(a), 31(b), 31(c), 31(d) and inert gases entering via inert gas valves 30(a), 30(b), 30(c), 30(d) through the ALD device 100 (see FIG. 3). The manifold assembly 10 is further configured to selectively mix one or more of the inert gases entering via valves 30(a)-(d) with one of reactant gases entering via valves 31(a)-(d) during a given pulse. The resulting mixture enters the reaction chamber 1. After each pulse, the ALD device 100 exhausts any unreacted reactant and inert gases from the reaction chamber 1 via the exhaust pipe 24, such as through purging. The locations of the valves shown herein are for illustrative purposes only and can be located at different locations along a gas line. Preferably the valves are located in close proximity to or on the manifold assembly 10 itself to reduce the length of the gas line downstream of the valve. The reactant gas valves 31(a)-31(d) may, for example, be disposed approximately 10 mm from the inlet manifold block, to provide a short and easily purged line. As will be described below, the various valves in the exemplary embodiments described herein are designated to flow a gas or a mixture of one or more gases into the manifold assembly 10. However, the invention is not limited to the exemplary embodiments disclosed herein.

The order that the reactant gases are cycled through the ALD device 100 depends on the desired product. To minimize any interaction between one or more reactant gases prior to each gas entering the reaction chamber 1, the inert gas entering via valves 30(a)-(d) is periodically cycled or continuously flowed through the ALD device 100 between pulses of the reactant gases. In this way, the inert gases purge the lines and the reaction chamber 1. As will be explained below, various reactant gases and inert gases are systematically cycled through the ALD device 100 so as to form a deposit on the wafer inserted through the gate valve 6.

Figure 4:
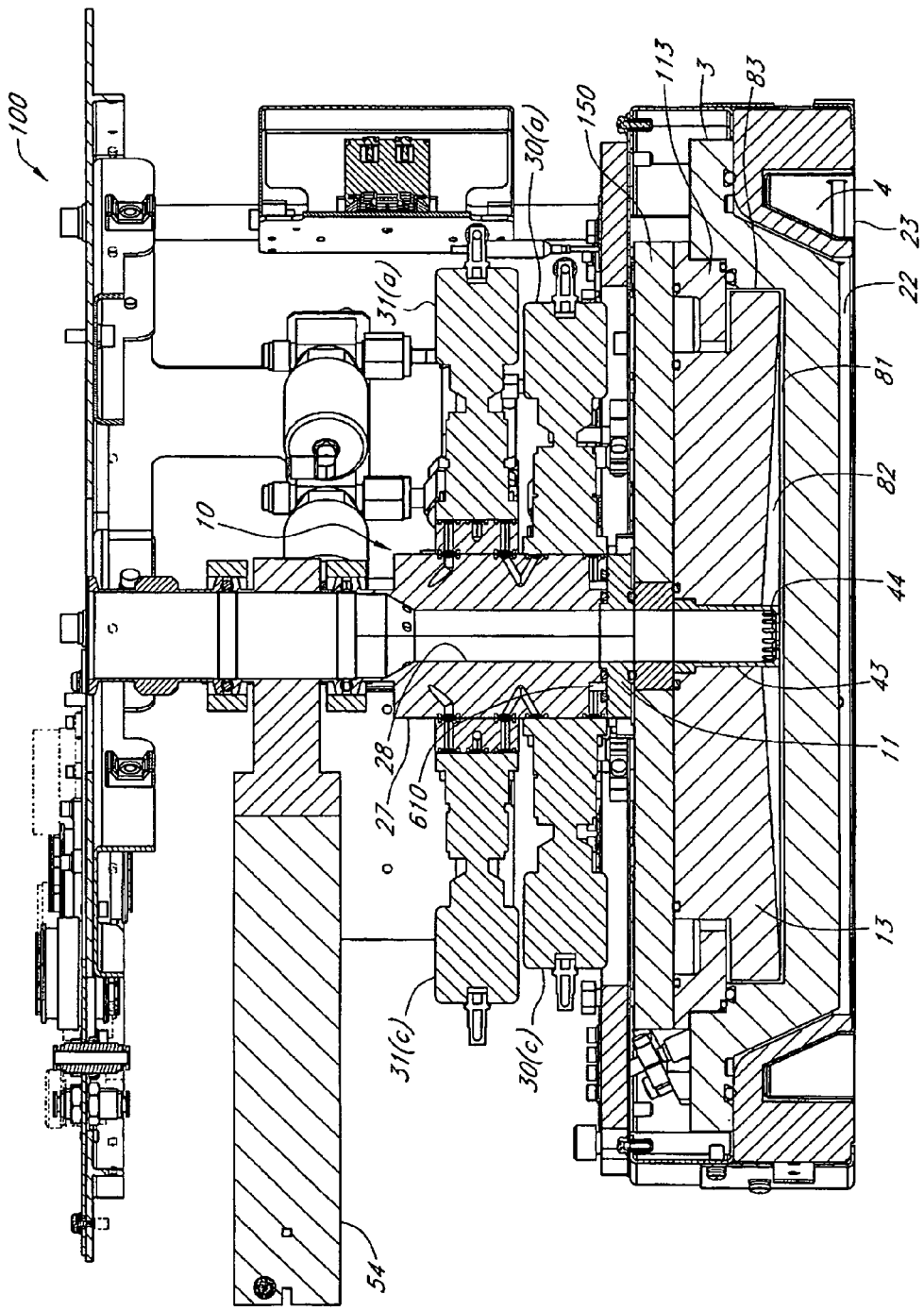
FIG. 4 is a cross sectional view of an ALD device showing a manifold assembly coupled to an ALD reactor according to an embodiment.

As best seen in FIG. 4, the gas-introduction manifold assembly 10 is mounted over the dispersion plate 3. The manifold assembly 10 is coupled to a tubular gas-introduction member 11 that extends through the lid 2 (see FIG. 1). An embodiment of the manifold assembly 10 is described below in connection with FIG. 1. The member 11 connects to a downstream end of the manifold assembly 10 and receives reactant and inert gases from the manifold assembly 10. Exemplary inert gases include nitrogen and argon gas. The deposition process utilizes the inert gases to purge and or mix with the reactant gases. A radical source 12 is shown in the illustrated embodiment connected to the manifold assembly 10 via a valve 16, which may be a fully-opening valve. In certain embodiments, the valve 16 is a dual action gate valve. Opening of the valve 16 introduces radicals from various gases into the manifold assembly 10. The member 11 is in flow communication with a gas-dispersion portion 13. Gas flowing from the member 11 is diffused by the gas-dispersion portion 13. The remote plasma is primarily used for chamber cleaning but may also be used for processing.

In certain embodiments, the member 11 has an intermediate dispersion mechanism 43. FIG. 2 is a schematic drawing showing one example of an intermediate dispersion element 43. The illustrated intermediate dispersion element 43 has a cylindrical shape as shown in FIG. 2 and can be attached to the downstream end or tip of the member 11 (see FIG. 1). In certain embodiments, one or more pores or slits 44 in the walls of the element 43 provide diffuse flow exit paths for gas entering from the member 11. The pores 44 may be located so as to evenly discharge the gas in a radial direction away from the element 43. In addition to or instead of pores 44, one or more pores 45 may extend through the bottom surface of the element 43 discharging gas in a vertical direction towards the dispersion plate 3. Preferably, the one or more pores 45 do not line up with the pores in the dispersion plate 3, for better distribution of gases across the plate 3.

The cross-sectional profile of the gas-dispersion portion 13 illustrated in FIG. 1 has a horn shape. In order to accommodate changes in exhaust flow through the reaction chamber 1 in a short period of time, an internal capacity of the gas-dispersion portion 13 is preferably small. In certain embodiments, the gas-dispersion portion 13 has a flat truncated cone shape with approximately an angle of 3-30 degrees relative to the horizontal lower surface of the gas-dispersion portion 13. Embodiments may include angles of 5, 10, 15, 20, 25, and values between these values, but preferably approximately 5-15 degrees, so as to more evenly distribute the dispersed gas.

In certain embodiments, a distance between the lower surface of the gas-dispersion portion 13 and the gas-dispersion plate 3 is approximately 2-10 mm, including 3 mm, 5 mm, 7 mm, and values between these values. Having the dispersion portion 13 closer to the dispersion plate 3 may more evenly distribute the gas across the plate 3. In certain embodiments, the shape of internal walls of the gas-dispersion portion 13 may be smooth so as to promote smooth gas flow.

In certain embodiments, a heater 42 is provided in an internal wall of the dispersion portion 13. The heater 42 heats gas entering the dispersion portion 13. A second heater 26 may be provided in the dispersion plate 3, particularly at the peripheral edge, so as to adjust thin-film formation.

A slit exhaust port 17 is formed between a tip of the gas-dispersion portion 13 and the dispersion plate 3. The slit has an annular (e.g. circular) shape extending around the outer tip of the dispersion portion 13. Various shapes for the exhaust port may be utilized but is preferably selected so as to minimize regions where the gas flow is hydrodynamically disrupted. For example, the shape of the exhaust port can have multiple circular-arc-shaped slits, multiple circular pores, etc. The width of the opening through the slits or pores 17 may be the same as the distance between the lower surface of the gas-dispersion portion 13 and the gas-dispersion plate 3, or approximately between 2 mm and 5 mm.

The exhaust slit 17 is communicatively connected with an upper space 18. The upper space 18 is formed by an upper external wall of the dispersion portion 13 and the lower surface of the upper lid 2. The upper space 18 is communicatively connected with a showerhead plenum 14 located between a lower surface of the gas dispersion portion 13 and the dispersion plate 3. In certain embodiments, the distance between the upper external wall of the dispersion portion 13 and the lower surface of the upper lid 2 is approximately the same as the distance between the lower surface of the gas dispersion portion 13 and the dispersion plate 3.

An exhaust flange 19 connects to the upper lid 2 and receives gas exhausted from the upper space 18 and the showerhead plenum 14. Opening and closing of a showerhead exhaust valve 20 allows or prevents gas from exhausting from the upper space 18 and the showerhead plenum 14.

As gas pressure drops when the gas passes through the upper space 18 via the slit 17, it may be make it more difficult to exhaust the gas over a short period of time between reactant pulses. Consequently, in certain embodiments, it may be advantageous to have a duct extending through the slit 17 and connecting to the exhaust flange 19. It has been found that an annular duct increases gas flow to the exhaust flange 19 as compared to embodiments with the upper space 18. This is because the internal surface area of the duct which contacts the gas is less than the surface area contacted by the gas when it flows from the upper space 18. However, because the exhaust flange 19 is located offset relative to the annular duct, the annular duct does not uniformly exhaust gas as compared to embodiments using the upper space 18. For example, in embodiments using the upper space 18, the exhaust flange 19 can be located near the center of the upper space 18 and receive exhausted gas uniformly.

The gas passes through the gas-dispersion portion 13 and reaches the showerhead plenum 14. The gas further travels through gas-discharge ports 21 in the dispersion plate 3. The gas that passes through the gas-discharge ports 21 reaches the reaction space 22 between the substrate support 8 and the dispersion or showerhead plate 3. The gas may then continue and reach a surface of the substrate 15. The gas then may continue through a ring-shaped slit 23 formed in the exhaust duct 4 and be exhausted from an exhaust pipe 24 communicatively connected with the slit 23. In certain embodiments, the gas flow rate from the dispersion plate 3 and to the reaction space 22 is approximately 2-3 liters/sec.

By feeding radio-frequency power to the dispersion plate 3 from an electrode 25, plasma can be generated between the dispersion plate 3 and the substrate support 8. For example, in situ plasma is created between the dispersion plate 3 and the substrate support 8 for plasma enhanced atomic layer deposition (PEALD) processing. Remote plasma creation is used for performing certain processes of PEALD and for periodic reaction chamber 1 cleaning between substrate 15 processing, for example between every lot of wafers. The remote plasma is generated using an ex-situ plasma generator illustrated as the remote radical or excited species source 12. The generator may operate at, for example, a frequency of 400 kHz and be obtained from MKS Instruments located in Wilmington, Mass. The generator may be mounted on top of the manifold assembly 10 or further upstream. The valve 16 separates the remote plasma generator from the manifold assembly 10. Radicals are generated in the remote plasma generator either for chamber cleaning or deposition. The radicals are allowed to flow/drift/diffuse throughout the dispersion portion 13 and to the surface of the substrate 15. Preferably the radical source 12 is mounted close to the chamber 1 and the valve 16 opens wide to maximize excited species survival and thus cleaning efficiency.

An RF generator for the in-situ direct plasma generation may operate at, for example, 13.56 MHz. Such an RF generator and a matching network may be obtained from ADTEC Technology Inc. located in Fremont, Calif. The matching network may be mounted on top of the reaction chamber 1. A transmission line is connected between the output of the matching network and the dispersion plate 3. The dispersion plate 3 (FIG. 1), dispersion portion 13 (FIG. 1) and upper lid ring 113 (FIG. 4) are RF hot. The remainder of the conductive elements defining the reaction space 22, particularly the substrate support 8, is at ground. The direct plasma is generated only between the dispersion plate 3 and the substrate support 8.

Once processing is complete, the substrate support 8 is lowered and the substrate 15 can be removed from the deposition chamber via the same gate valve 6.

A control system (not shown) is configured to control the apparatus during processing of the substrate 15. For example, the control system can include a computer control system and electrically controlled valves to control the flow of reactant and inert gases into and out of the device and the application of RF power. The control system can include modules such as a software or hardware component, such as a FPGA or ASIC, which performs certain tasks. A module may advantageously be configured to reside on the addressable storage medium of the computer control system and be configured to execute on one or more processors.

FIG. 3 shows a representative sequence for introducing gases to the reaction chamber 1. In Step 1 shown in FIG. 3, the showerhead exhaust valve 20 is closed. Reactant gas valve 31(a) is opened to allow Gas A to enter a central bore 28 of the manifold assembly 10. In this example, Gas A continues into the gas-dispersion portion 13, passes through the dispersion plate 3, and is supplied into the reaction space 22. Gas A is exhausted from the reaction space 22 through the exhaust slit 23 and to the exhaust pipe 24.

After Gas A is supplied for a given period of time, in Step 2, the reactant gas valve 31(a) for Gas A is configured to prevent gas A from entering the central bore 28 of the manifold assembly 10 and allow an inert gas flowing from the inert gas valve 30(a) to enter the central bore 28 of the manifold assembly 10. At this time, depending on the particular process or chemistry involved, the showerhead exhaust valve 20 may be fully opened. The remaining Gas A is purged by the inert gas. The inert gas is introduced from the inert gas valve 30(a) into the reactant gas line used for Gas A at a point upstream of reactant gas valve 31(a). In this way, the inert gas flows through the reactant gas valve 31(a) and flushes or purges the reactant gas lines to prevent reactant diffusion during subsequent steps. Internal inert gas channel 610 (see FIG. 4) supplies the inert gas entering the inert gas valve 30(a). In certain embodiments, the internal inert gas channel 610 is located within the manifold assembly 10.

In Step 3, the reactant gas valve 31(a) is configured to prevent both reactant Gas A and the inert gas from entering the central bore 28 of the manifold assembly 10. The inert gas valve 30(a) in FIG. 3 is closed in step 3, but this does not have to be the case. In the illustrated embodiment, where it is desirable to halt inert gas through this channel, the three-way reactant gas valve 31(a) prevents inert gas from entering the central bore 28 of the manifold assembly 10 regardless of the configuration of the inert gas valve 30(a).

Gas B is introduced in the central bore 28 of the manifold assembly 10 by opening the reactant gas valve 31(b). In this case, Gas B is introduced from the gas-introduction portion 11 (FIG. 1) and into the gas-dispersion portion 13. Gas B then continues through the dispersion plate 3 and is supplied onto the substrate surface 15. While traversing the substrate surface 15, Gas B pulse saturates the surface of the substrate. Adsorption or reaction occurs between Gas B and the surface of the substrate as left by the previous pulse.

After passing across the reaction space 22 and in a radial direction, the Gas B flows towards the exhaust pipe 24 and through the exhaust slit 23. The exhaust pipe 24 is configured to collect excess gas and any byproduct after the gas has saturated the wafer. In an embodiment, a region within the exhaust pipe 24 is at a lower pressure than the pressure in the reaction chamber 1. A negative pressure source or vacuum can be in flow communication with the exhaust pipe 24 and/or exhaust slit 23 to draw the gas from the reaction chamber 1. Gas B is exhausted from the exhaust slit 23 to the exhaust pipe 24.

After a given period of time, the reactant gas valve 31(b) is closed and the supply of Gas B is shut off. In the state similar to that shown in Step 2, except with inert gas flowing through the Gas B channel instead of the Gas A channel, the remaining Gas B is exhausted from the valve 20. By repeating the supply of reaction Gas A and the supply of reaction Gas B as part of these four steps, each cycle deposits less than a molecular monolayer. The skilled artisan will appreciate that steric hindrance from the bulky precursors tends to block reactive sites and reduce growth rates to less than a monolayer per cycle.

Even if three kinds or more of reaction gases are used, film formation can be easily achieved by repeating steps of supplying three kinds or more of reaction gases and steps of purging respective gases.

In certain embodiments, it is possible to easily purge an inner area of the dispersion plate 3 by opening or closing the showerhead exhaust valve 20. Additionally, because the degree which the valve 20 is opened or closed may be varied, complete shut-off is not required.

Also, in certain embodiments, depending on chemistry, one or more of the reactant lines (A, B, C, D) can be open at all times during the process. This may occur, for example, when the reactant gas sources act as reducing agents for the precursors delivered in pulse steps, which only react when RF power is applied.

When applying radio-frequency power to the gas-dispersion plate 3, the reaction gas can also be supplied as a direct plasma gas. By providing the heater 42 (FIG. 1) in the gas-dispersion portion 13, it is possible to raise temperatures of the inside of the dispersion portion 13. Consequently, when using organic metal materials which have low vapor pressure and easily cohere, it becomes possible to exhaust them without cohesion.

FIG. 4 is a cross sectional view showing in detail an embodiment of the ALD device 100. This figure does not show a substrate support or susceptor and all gas valves. Gas A reactant gas is introduced to the manifold assembly 10 through valve 31(a). Gas A is then introduced into a first compartment 82 of the dispersion portion 13 through the slits 44 in the intermediate dispersion element 43. The first compartment 82 is defined in part by a bottom plate having slits. Gas A reactant gas passes through the slits and flows into a second compartment 81 which is above an upper surface of the dispersion plate 3 having a plurality of bores (not shown). The first compartment 82 and the second compartment 81 constitute a showerhead plenum.

In certain embodiments, the first compartment 82 does not have a bottom plate and there is no clear boundary between the first compartment 82 and the second compartment 81. Gas A is discharged to the reaction space 22 of the reaction chamber 1 through the bores formed in the dispersion plate 3. The reaction space 22 is located above the substrate support 8 (FIG. 1). During the above process, the reaction space 22 is constantly exhausted using an exhaust duct 4 through an annular slit 23, wherein the gas is drawn radially toward the outer periphery of the reaction space 22. The annular slit 23 is located around the outer periphery of the substrate support 8. The gas dispersion portion 13 is fixed to the dispersion plate 3 via an upper lid ring 113 above which an insulation plate 150 is placed.

The gas dispersion portion 13 and the dispersion plate 3 do not directly contact each other, and an annular gap 83 is formed along the outer periphery of the gas dispersion portion 13. This annular gap 83 communicates with the exhaust flange 19 (see FIG. 1) through the upper lid plate 113.

When purging the first and second compartments 82, 81, a purge gas is introduced thereto through one of the valves 30(a)-(d), an associated one of the reactant gas valves 31(a)-(d), the manifold assembly 10, and the intermediate dispersion element 13. The main purge flows from the inert gas line 54 and through the manifold assembly 10. Inert gas from the reactant gas valves 31(a)-(d) and the inert gas valves 30(a)-

(d) flush or purge the lines between the reactant valves and the central bore 28. Simultaneously, the first and second compartments 82, 81, are evacuated using the exhaust flange 19 through the annular gap 83. The reaction space 22 is constantly evacuated through the slit 23 and the exhaust duct 4.

Figure 5:
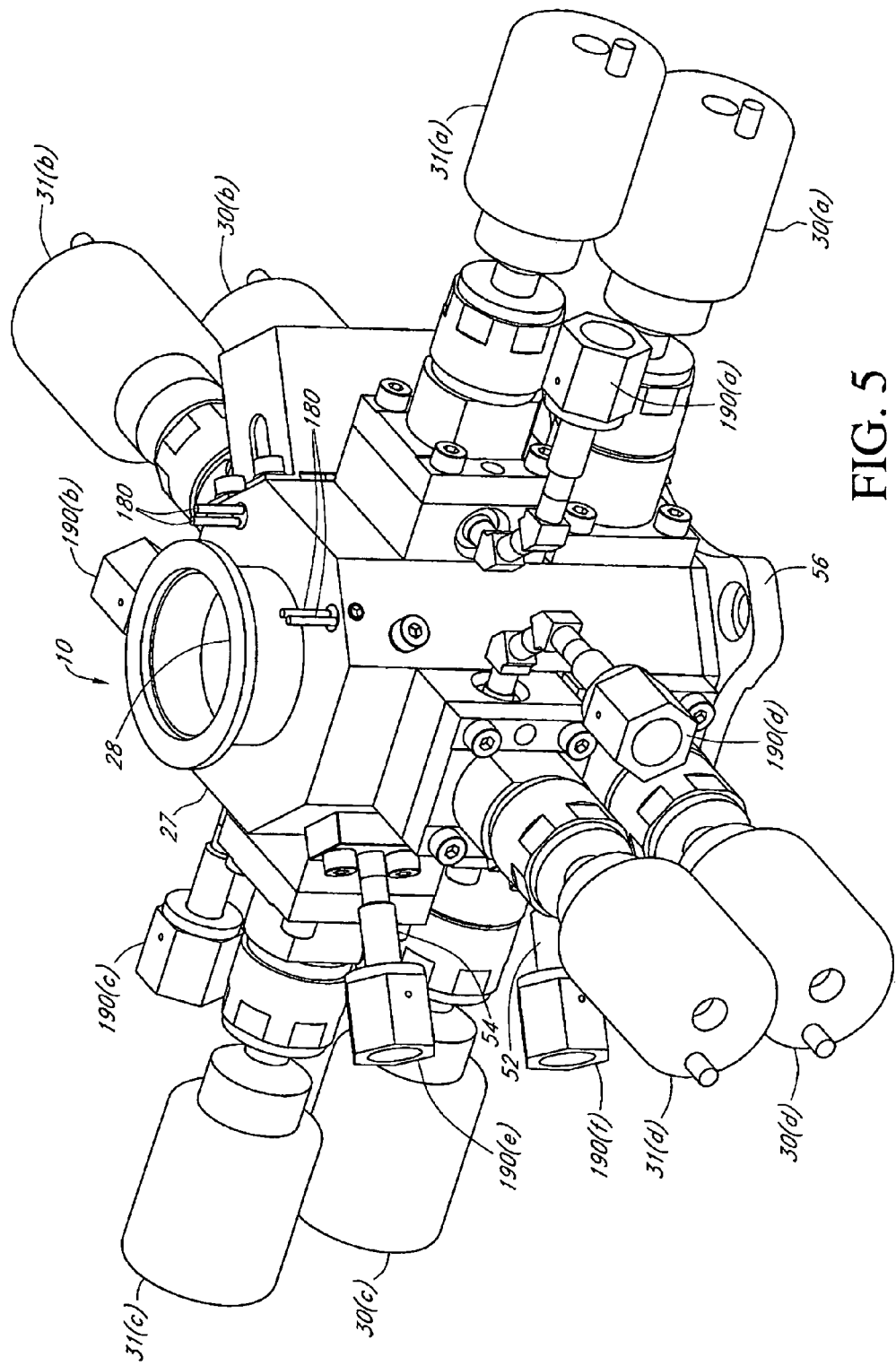
FIG. 5 is a perspective view of the manifold assembly illustrated in FIG. 4.

As best seen in FIG. 5, in this example, the manifold assembly 10 includes four reactant gas valves 31(a)-(d), an inert channel supply line 52, and an inert mixer supply line 54. Each reactant valve 31(a)-(d) is paired with an inert gas valve 30(a)-(d). Reactant valve 31(a) is coupled to inert valve 30(a). Reactant valve 31(b) is paired with inert valve 30(b). Reactant valve 31(c) is paired with inert valve 30(c). Reactant valve 31(d) is paired with inert valve 30(d). The ALD device 100 can include greater or fewer reactant valves and inert valves depending on the configuration of the ALD device 100. Moreover, each reactant line may or may not be paired to one inert gas valve. For example, one or more of the reactant lines may be paired to the inert gas valves while another reactant line is not. The reactant line that is not paired to the valves could be purged by other means.

Coupling 190(a) couples the reactant gas valve 31(a) to a reactant source A 620 (FIG. 6). Coupling 190(b) couples the reactant gas valve 31(b) to a reactant source B 626 (FIG. 6). Coupling 190(c) couples the reactant gas valve 31(c) to a reactant source C 632 (FIG. 6). Coupling 190(d) couples the reactant gas valve 31(d) to a reactant source D 638 (FIG. 6).

Coupling 190(f) couples the internal inert gas channel 610 (see FIG. 6) to an inert or purge gas source 644 (FIG. 6). Coupling 190(e) couples the central bore 28 or inside of the manifold assembly 10 with the inert gas source 644 separately from the internal inert gas channel 610.

In the embodiment illustrated in FIG. 5, inert channel supply line 52 and couplings 190(a)-(d) provide a flow path to a valve and toward the inside of the manifold assembly 10. Inert channel supply line 52 connects to the internal inert gas channel 610. In the illustrated embodiment, each of the inert gas valves 30(a)-(d) are located downstream of the internal inert gas channel 610. Line 54 provides a path to the inside of the manifold assembly 10 without passing through a valve.

In the embodiment shown in FIG. 5, the couplings 190(a)-(d) flow reactant gases into the manifold assembly 10. The inert gas line 54 provides a passageway to flow inert gas directly to the central bore 28. The resulting mixture (one reactant at a time with an inert gas) flows downward toward the reaction chamber 1. An insulator plate 56 lies adjacent to an insulation plate 150 (FIG. 4) when assembled on the ALD device 100.

The manifold assembly 10 includes one or more heater cartridges 180 configured to control wall temperature. The reactant gas passing through the manifold assembly 10 is heated by the manifold and heater cartridges 180. Controlling the temperature of the reactant gases as they pass through the manifold assembly 10 reduces the likelihood that condensation or thermal decomposition of the gas will occur. In certain embodiments, each reactant gas valve 31(a)-(d) is separately heated by one or more heater cartridges 180. In the illustrated embodiment, two of the reactant valves have heaters to facilitate use of precursors with low vapor pressure (e.g., liquid or solid at standard conditions, such as $ZrCl_2$, $HfCl_2$, TMA and other metalorganics), while two do not. For example, a first set of one or more heater cartridges 180 may be located within the manifold assembly 10 and near to the lines carrying reactant gas A. A second set of one or more heater cartridges 180 may be located within the manifold assembly 10 and near to the lines carrying reactant gas B. The first and second sets of heater cartridges 180 may be separately controlled so as to heat gas A to a different temperature than gas B. In certain embodiments, the heater cartridges 180 maintain a wall temperature up to 200° C. within the manifold assembly 10. One or more thermal switches may be employed to monitor the temperature of the manifold assembly 10. It will be understood that the system includes other temperature sensor and control mechanisms to maintain various components of the system at desired temperatures.

Further, the system may maintain a different temperature for a first pair of valves 30, 31 and a second temperature for a second set of valves 30, 31 depending on the desired processing. While the illustrated embodiment contemplates heater cartridges driven by temperature sensor(s) defining a single zone for temperature control of the monolithic ALD inlet manifold, the illustrated embodiment can also be adapted for separated zone control for each precursor within the ALD manifold. For example, in the illustrated case of 4 precursors with separate manifold paths, five zones can be provided for separate thermal control of the flow path for each precursor the center hub and each of the four precursor lines (including valves) are treated as separate zones. To facilitate thermal separation of zones, the hub could be manufactured with a thermal air break limiting the mechanical and thermal connection between, for example, the body 27 and a base plate 606 (see FIG. 10) to small spot protrusions around the precursor gas inlet apertures. Additional heaters and thermocouples to monitor thermal control would be employed. Advantageously, temperatures of the flow paths upstream of the mixing point (e.g., the central bore) can be separately tuned for each reactant to minimize coating of the lines, whether by condensation, reaction or adsorption, and thus minimize clogging and/or downstream contamination.

FIG. 6 is a schematic view of gas flow paths through the manifold assembly 10 illustrated in FIG. 5 and shows four inert gas valves 31(a)-(d), each in flow communication with separate reactant gas valves 30(a)-(d). The manifold assembly 10 includes an internal inert gas channel 610 in flow communication with the four inert gas valves 30(a)-(d). FIG. 6 further illustrates the source for each reactant and inert gas. The reactant sources may represent gas containers, bubblers or other vaporizers, depending on whether reactants are solid, liquid, or gas under standard conditions. Additional valves (not shown) associated with the reactant and inert gas sources may be located outside of the manifold assembly 10.

Gas A flows from its source 620 and through line 622 before reaching reactant valve 31(a). Reactant gas valve 31(a) may be configured to allow or prevent flow of gas A through line 624 and into the central bore 28 of the manifold assembly 10 depending on the desired processing step. Gas B flows from its source 626 and through line 628 before reaching reactant valve 31(b). Reactant gas valve 31(b) may be configured to allow or prevent flow of gas B through line 630 and into the central bore 28 of the manifold assembly 10 depending on the desired processing step.

Gas C flows from its source 632 and through line 634 before reaching reactant valve 31(c). Reactant gas valve 31(c) may be configured to allow or prevent flow of gas C through line 636 and into the central bore 28 of the manifold assembly 10 depending on the desired processing step. Gas D flows from its source 638 and through line 640 before reaching reactant valve 31(d). Reactant gas valve 31(d) may be configured to allow or prevent flow of gas D through line 642 and into the central bore 28 of the manifold assembly 10 depending on the desired processing step. The illustrated four reactant valve embodiment is exemplary and more or less reactant valves could be used.

The inert gas flows from source 644 (which may include multiple gas containers) and through the inert channel supply line 52 before reaching the internal inert gas channel 610. The internal inert gas channel 610 is preferably located within the manifold assembly 10. By including the inert gas channel 610 within the manifold assembly 10, maintenance proficiency is enhanced. Advantageously, the manifold assembly 10 may be tested on a bench prior to re-assembly onto the reactor. With the inert gas channel 610 included in the manifold assembly 10, thermal control of the inert gas is more uniform with the precursor gas since the inert gas and the precursor gas are fed through the same thermal mass or manifold assembly 10.

When the inert gas channel is located outside the manifold and inside the reactor top, additional o-rings are required in the chamber. These additional o-rings can affect vacuum integrity of the reactor. Cleaning may also be more complicated since the entire reactor is disassembled to access an inert gas channel that is located within the reactor.

The internal inert gas channel 610 is further in flow communication with one or more of the inert gas valves 30($a$)-($d$). In the exemplary embodiment illustrated in FIG. 6, the internal inert gas channel 610 is in flow communication with four inert gas valves 30($a$)-($d$).

The inert gas flows from the internal inert gas channel 610 and through line 646 before reaching inert gas valve 30($a$). In certain embodiments, the inert gas valve 30($a$) is a two port valve. The two port valve controls flow of the inert gas between the internal inert gas channel 610 and the reactant gas valve 31($a$). The two port valve has one input port in flow communication with the internal inert gas channel 610 and an output port in flow communication with reactant gas valve 31($a$) via line 648. In this way, the inert gas valve 30($a$) may be configured to allow or prevent flow of inert gas between line 646 and line 648.

Reactant gas valve 31($a$) is in flow communication with line 648. In addition to allowing or preventing reactant gas A from reaching the central bore 28 of the manifold assembly 10 from line 622 as described above, the reactant gas valve 31($a$) is further configured to allow or prevent flow of inert gas through line 624 and into the central bore 28 of the manifold assembly 10. Thus, the reactant gas valve 31($a$) may be configured to separately allow or prevent the inert gas and the reactant gas A from entering line 624.

In a preferred embodiment, reactant gas valve 31($a$) is a three port valve. A first port of reactant gas valve 31($a$) is in flow communication with line 622 and receives reactant gas A. A second port of reactant gas valve 31($a$) is in flow communication with line 648 and receives an inert gas. A third or exit port for reactant gas valve 31($a$) is in flow communication with the central bore 28 of the manifold assembly 10 via line 624.

The inert gas flows from the internal inert gas channel 610 and through line 650 before reaching inert gas valve 30($b$). In certain embodiments, the inert gas valve 30($b$) is a two port valve. The two port valve controls flow of the inert gas between the internal inert gas channel 610 and the reactant gas valve 31($b$). The two port valve has one input port in flow communication with the internal inert gas channel 610 and an output port in flow communication with reactant gas valve 31($b$) via line 652. In this way, the inert gas valve 30($b$) may be configured to allow or prevent flow of inert gas between line 650 and line 652.

Reactant gas valve 31($b$) is in flow communication with line 652. In addition to allowing or preventing reactant gas B from reaching the central bore 28 of the manifold assembly 10 from line 628 as described above, the reactant gas valve 31($b$) is further configured to allow or prevent flow of inert gas through line 630 and into the central bore 28 of the manifold assembly 10. Thus, the reactant gas valve 31($b$) may be configured to separately allow or prevent the inert gas and the reactant gas B from entering line 630.

In a preferred embodiment, reactant gas valve 31($b$) is a three port valve. A first port of reactant gas valve 31($b$) is in flow communication with line 628 and receives reactant gas B. A second port of reactant gas valve 31($b$) is in flow communication with line 652 and receives an inert gas. A third or exit port for reactant gas valve 31($b$) is in flow communication with the central bore 28 of the manifold assembly 10 via line 630.

The inert gas flows from the internal inert gas channel 610 and through line 654 before reaching inert gas valve 30($c$). In certain embodiments, the inert gas valve 30($c$) is a two port valve. The two port valve controls flow of the inert gas between the internal inert gas channel 610 and the reactant gas valve 31($c$). The two port valve has one input port in flow communication with the internal inert gas channel 610 and an output port in flow communication with reactant gas valve 31($c$) via line 656. In this way, the inert gas valve 30($c$) may be configured to allow or prevent flow of inert gas between line 654 and line 656.

Reactant gas valve 31($c$) is in flow communication with line 656. In addition to allowing or preventing reactant gas C from reaching the central bore 28 of the manifold assembly 10 from line 634 as described above, the reactant gas valve 31($c$) is further configured to allow or prevent flow of inert gas through line 636 and into the central bore 28 of the manifold assembly 10. Thus, the reactant gas valve 31($c$) may be configured to separately allow or prevent the inert gas and the reactant gas C from entering line 636.

In a preferred embodiment, reactant gas valve 31($c$) is a three port valve. A first port of reactant gas valve 31($c$) is in flow communication with line 634 and receives reactant gas C. A second port of reactant gas valve 31($c$) is in flow communication with line 656 and receives an inert gas. A third or exit port for reactant gas valve 31($c$) is in flow communication with the central bore 28 of the manifold assembly 10 via line 636.

The inert gas flows from the internal inert gas channel 610 and through line 658 before reaching inert gas valve 30($d$). In certain embodiments, the inert gas valve 30($d$) is a two port valve. The two port valve controls flow of the inert gas between the internal inert gas channel 610 and the reactant gas valve 31($d$). The two port valve has one input port in flow communication with the internal inert gas channel 610 and an output port in flow communication with reactant gas valve 31($d$) via line 660. In this way, the inert gas valve 30($d$) may be configured to allow or prevent flow of inert gas between line 658 and line 660.

Reactant gas valve 31($d$) is in flow communication with line 660. In addition to allowing or preventing reactant gas D from reaching the central bore 28 of the manifold assembly 10 from line 640 as described above, the reactant gas valve 31($d$) is further configured to allow or prevent flow of inert gas through line 642 and into the central bore 28 of the manifold assembly 10. Thus, the reactant gas valve 31($d$) may be configured to separately allow or prevent the inert gas and the reactant gas D from entering line 642.

In a preferred embodiment, reactant gas valve 31($d$) is a three port valve. A first port of reactant gas valve 31($d$) is in flow communication with line 640 and receives reactant gas D. A second port of reactant gas valve 31 ($d$) is in flow communication with line 660 and receives an inert gas. A third or exit port for reactant gas valve 31($d$) is in flow communication with the central bore 28 of the manifold assembly 10 via line 642.

The terms "prevent" and "allow" are relative terms and are not limited to the sealing off of gas flow or to permitting full flow. For example, reactant gas valve 31(a) is configured to allow reactant gas flow when reactant gas flowing through the valve is increased. Similarly, reactant gas valve 31(a) is configured to prevent reactant gas flow when reactant gas flowing through the valve is decreased. Further, the lengths of the lines illustrated in FIG. 6 are for ease of identification and may shorter or longer depending on the desired configuration. In certain embodiments, it may be preferred to shorten one or more lines to reduce the amount of non-reacted reactants to be purged from the manifold assembly 10. In fact, the "lines" of FIG. 6 within the manifold assembly 10 are all machined channels within the central block and/or appended plates, such that the distances between the valves and the reaction chamber are minimal, reducing purge times, as will be appreciated from FIGS. 4-5 and 7-10.

An inert mixer supply line 54 couples the central bore 28 or inside of the manifold assembly 10 with the inert gas source 644 separately from the internal inert gas channel 610. Line 54 provides a path to the central bore 28 without passing through a valve. In certain embodiments, a valve 662 controls flow of the inert gas entering the manifold assembly 10 from line 54.

FIG. 7 is a top view of the manifold apparatus 10 from FIG. 5 illustrating reactant gas valves 31(a)-(d) and inert gas valves 30(a)-(d) coupled to the central body 27 of the manifold assembly 10. The manifold assembly 10 is configured to route reactant gases entering via couplings 190(a)-(d) and inert gas entering via coupling 190(e) to the central bore 28 of the manifold assembly 10. The coupling 190(a) is in flow communication with reactant gas valve 31(a) via line 622. The coupling 190(b) is in flow communication with reactant gas valve 31(b) via line 628. The coupling 190(c) is in flow communication with reactant gas valve 31(c) via line 634. The coupling 190(d) is in flow communication with reactant gas valve 31(d) via line 640. The coupling 190(e) is in flow communication with the central bore 28 of the manifold assembly 10 via line 54.

The manifold assembly 10 may route a single gas or multiple gases at the same time to the central bore 28 of the manifold assembly 10 during a given pulse. Preferably, in ALD mode, one reactant gas is mixed with inert gas in the bore 28. The resulting mixture enters the deposition chamber 1 (FIG. 1). After each pulse, the ALD exhausts any unreacted reactant and inert gases from the deposition chamber via the exhaust pipe 24 and from the showerhead assembly via the showerhead exhaust valve 20 (FIG. 1), such as through purging.

Inert gas may continually flow to the central bore 28 of the manifold assembly 10 via line 54 during processing, intermittingly, or only during purge operations. As discussed above, inert gas may also flow to the internal inert gas channel 610 via the inert channel supply line 52 (FIG. 6) within the manifold assembly 10. The internal inert gas channel 610 is in flow communication with the inert gas valves 30(a)-(d).

Figure 9:
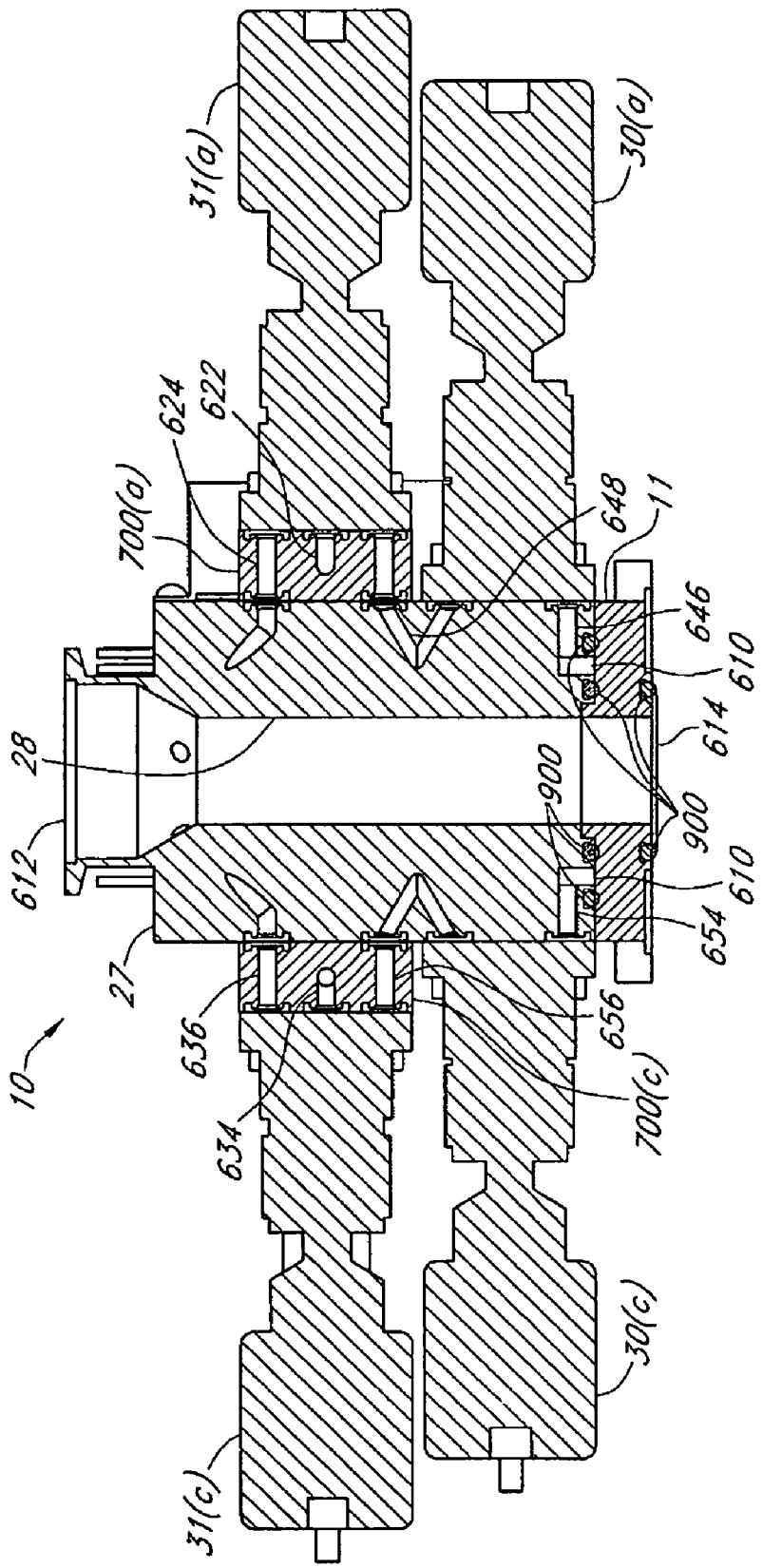
FIG. 9 is an enlarged cross-sectional view taken along lines 9-9 of FIG. 7, showing flow passageways among the reactant valves, the inert gas valves, and the body of the manifold.

The inert gas valves 30(a)-(d) attach directly to the body 27 of the manifold assembly 10. As seen in FIGS. 8 and 9, each reactant gas valve 31(a)-(d) may be mounted on the body 27 using a spacer block 700(a)-(d) which attaches to the body 27. The spacer blocks 700(a)-(d) are provided with openings and screw holes which mate with the reactant gas valves 31(a)-(d). The spacer blocks 700(a)-(d) ease manufacturing of the manifold assembly 10. Spacer block 700(a) is associated with reactant gas valve 31(a) and provides flow paths between the body 27 of the manifold assembly 10 and the reactant gas valve 31(a). Spacer block 700(b) is associated with reactant gas valve 31(b) and provides flow paths between the body 27 of the manifold assembly 10 and the reactant gas valve 31(b). Spacer block 700(c) is associated with reactant gas valve 31(c) and provides flow paths between the body 27 of the manifold assembly 10 and the reactant gas valve 31(c). Spacer block 700(d) is associated with reactant gas valve 31(d) and provides flow paths between the body 27 of the manifold assembly 10 and the reactant gas valve 31(d).

FIG. 8 is a cross-sectional view taken along lines 8-8 of FIG. 7, while FIG. 9 is a cross-sectional view taken along lines 9-9 of FIG. 7. Each spacer block 700(a)-(d) provides a portion of the gas routing paths to and from the associated reactant gas valve 31(a)-(d). The gas routing paths illustrated in FIGS. 8 and 9 correspond to lines described with reference to FIG. 6. An entire line described in FIG. 6 may represent an entire passageway in a single component of the manifold assembly 10 or portions of passageways in multiple components of the manifold assembly 10. For example, line 652 illustrated in FIGS. 6 and 8 corresponds to at least portions of passageways in both the body 27 of the manifold assembly 10 and in the spacer block 700(b). Line 660 illustrated in FIGS. 6 and 8 corresponds to at least portions of passageways in the body 27 of the manifold assembly 10 and in the spacer block 700(d).

The body 27 in the illustrated embodiment has a tubular shape with a central bore 28. The body 27 includes an entrance 612 and an exit 614. The central bore 28 can have a lower portion having a cylindrical shape and an upper portion having a conical shape. The cross-sectional area in the region of the entrance 612 is preferably greater than the cross-sectional area of the exit 614. In some embodiments, the cross-sectional flow area of the central bore 28 gradually decreases as the mixture migrates towards the exit 614 and forms a tapered or "funnel" passage.

In certain embodiments, at least a portion of the inner surface of the body 27 has a conical shape which reduces the open cross-section area through the body 27 as the mixture flows towards the exit 614. The body 27 further includes attachment holes on the downstream or bottom surface for attaching the manifold assembly 10 to the showerhead plate of the reaction chamber 1.

In the illustrated embodiment, each spacer block 700(a)-(d) has three distinct passageways connected to the two input ports and the single output port of the associated reactant gas valve 31(a)-(d). For example, a first passageway or line 652 in both the spacer block 700(b) and the body 27 of the manifold assembly 10 connects the output port of the inert gas valve 30(b) to one of the two input ports for the reactant gas valve 31(b). The second passageway or line 628 connects coupling 190(b) to the other input port for the reactant valve 31(b). The third passageway or line 630 connects the output port of the reactant gas valve 31(b) with the central bore 28 of the manifold assembly 10. With respect to reactant gas valve 31(d), a first passageway or line 660 in both the spacer block 700(d) and the body 27 of the manifold assembly 10 connects the output port of the inert gas valve 30(d) to one of the two input ports for the reactant gas valve 31(d). The second passageway or line 640 connects coupling 190(d) to the other input port for the reactant valve 31(d). The third passageway or line 642 connects the output port of the reactant gas valve 31(d) with the central bore 28 of the manifold assembly 10. The inert gas valves 30(a)-(d) are partially obstructed from view by the reactant gas valves 31(a)-(d) in FIG. 7.

FIG. 9 is an enlarged cross-sectional view taken along lines 9-9 of FIG. 7, showing reactant valves 31(a), 31(c) and inert gas valves 30(a), 30(c) connected to the body 27 of the manifold assembly 10. Referring to FIGS. 7 and 9, spacer block 700(a) is associated with reactant gas valve 31(a) and provides flow paths between the body 27 of the manifold assembly 10 and the reactant gas valve 31(a). Spacer block 700(c) is associated with reactant gas valve 31(c) and provides flow paths between the body of the manifold assembly 10 and the reactant gas valve 31(c). A first passageway or line 648 in both the spacer block 700(a) and the body 27 of the manifold assembly 10 connects the output port of the inert gas valve 30(a) to one of the two input ports for the reactant gas valve 31(a). The second passageway or line 622 connects coupling 190(a) to the other input port for the reactant valve 31 (a). The third passageway or line 624 connects the output port of the reactant gas valve 31(a) with the central bore 28 of the manifold assembly 10. With respect to reactant gas valve 31(c), a first passageway or line 656 in both the spacer block 700(c) and the body 27 of the manifold assembly 10 connects the output port of the inert gas valve 30(c) to one of the two input ports for the reactant gas valve 31(c). The second passageway or line 634 connects coupling 190(c) to the other input port for the reactant valve 31(c). The third passageway or line 636 connects the output port of the reactant gas valve 31(c) with the central bore 28 of the manifold assembly 10.

Passageway or line 654 connects the input port of the inert gas valve 30(c) with the internal inert gas channel 610. Passageway or line 646 connects the input port of the inert gas valve 30(a) with the internal inert gas channel 610.

Referring to FIGS. 8 and 9, reactant gas enters the central bore 28 of the manifold assembly 10 via lines 624, 630, 636, 642 preferably off center from a centerline 702 so as to swirl the gas within the central bore 28 to enhance mixing. Swirling gas may promote mixing of the reactant gas with an inert gas and/or another reactant gas depending on the desired product. The gas mixture circles around inside the tubular body as the mixture migrates towards the deposition chamber 1.

In certain embodiments, one or more of the body 27, spacer 700(a)-(d), and valve 30(a)-(d), 31(a)-(d) components are stainless steel or other metallic material. With stainless steel, the manifold assembly 10 need not include o-rings, resulting in no dead zones. Advantageously, the lines or passageways are integrally formed within a chemically resistant metal block or body 27. In certain embodiments, the inert and reactant valves 30, 31 are stainless steel and commercially available from Swagelok Co. of Salon, Ohio. In a preferred embodiment, the Swagelok two port inert gas valves 30(a)-(d) are identified as part number 6LVV-MSM-ALD3T-W2-P-CS and the three port reactant gas valves 31(a)-(d) are identified as part number 6LVV-MSM-ALD3T-W3-P-CS. Each of the metal valves 30, 31 may be sealed against the metal and preferably stainless steel spacer 700 and body 27 of the manifolds with metal seals. In certain other embodiments, one or more components of the manifold assembly 10 are made from a ceramic material.

FIG. 9 further illustrates various metal seals located between surfaces of mating components. Of course, more or less metal seals could be used depending on, for example, the materials, tolerances, operating pressures, and gases associated with the mating components. Further, in certain embodiments, one or more components may be combined into a single component and therefore render any seals between the combined components unnecessary. For example, the spacer block 700(a)-(d) and associated reactant gas valve 31(a)-(d) could be combined into a single component and obviate the need for seals between the combined components. Further, the spacer block 700(a)-(d) associated with a reactant gas valve may extend beyond the side of the reactant gas valve so as to form a spacer for the adjacent inert gas valve (see FIG. 10). Alternatively, the reactant gas valve and the inert gas valve associated with the reactant gas valve may have separate spacers. Conventional seals 900 made from polymeric materials, such as for o-rings, are also employed to seal the manifold assembly 10 against the showerhead assembly.

Figure 10:
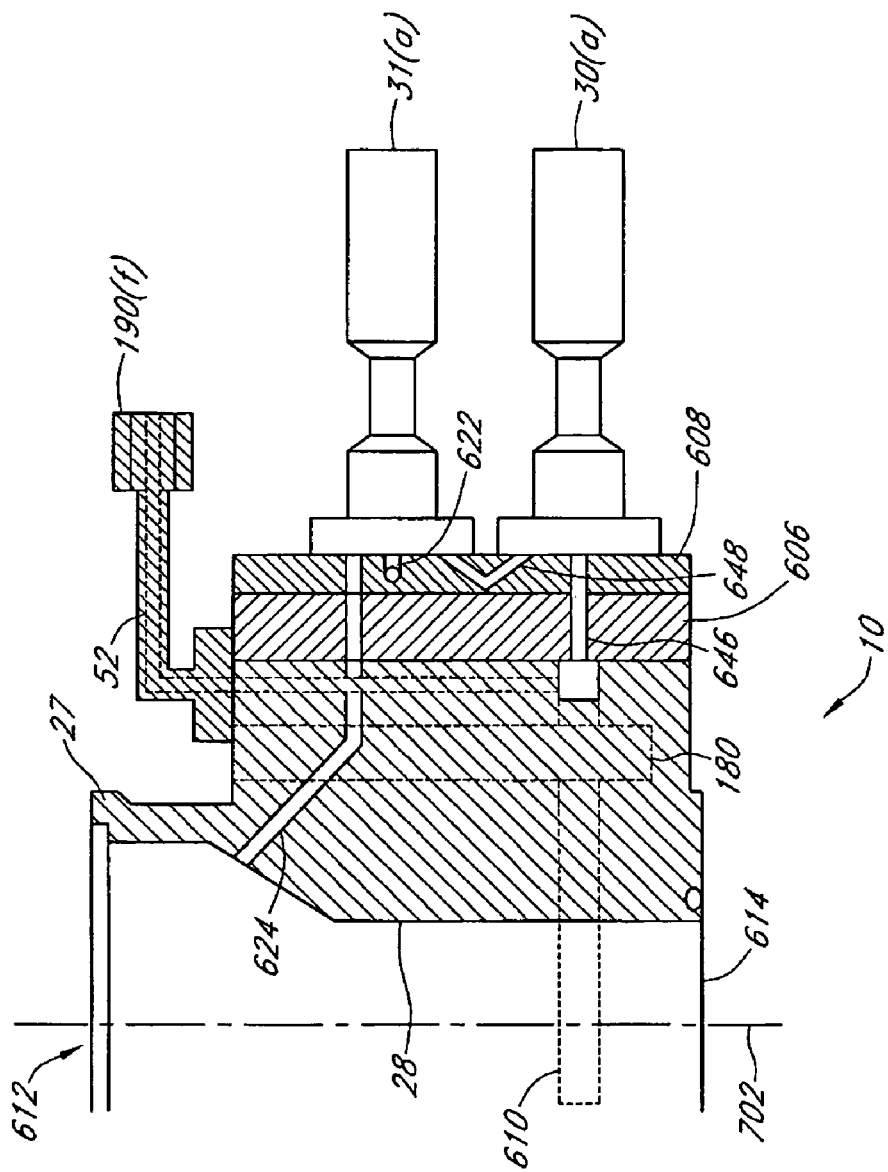
FIG. 10 is another embodiment of a manifold assembly having sub-components of dissimilar materials, such as aluminum and stainless steel, bonded together.

FIG. 10 schematically illustrates another embodiment of a manifold assembly 10 wherein the spacer blocks comprise sub-components of dissimilar materials, such as aluminum and stainless steel, bonded between the reactant gas valve 31(a) and its associated inert gas valve 30(a) and the body 27 of the manifold assembly 10. For this embodiment, reactant gas valve 31(a) and inert gas valve 30(a) are illustrated while reactant gas valves 31(b)-(d) and inert gas valves 30(b)-(d) are not. However, the following description applies equally to the other three pairs of reactant gas valves and associated inert gas valves 30(b), 31(b); 30(c), 31(c); 30(d), 31(d).

In this preferred embodiment, the valves 31(a), 30(a) are made of a stainless steel, for example 316 SS. Stainless steel advantageously increases the durability of the valves over lesser strength metals. The body 27 of the manifold assembly 10 is made from an aluminum or similar material and provides high thermal conductivity. Advantageously, aluminum is a relative light metal and provides enhanced thermal distribution in comparison to stainless steel. Alternatively, the body 27 may be made from 316 stainless steel. Of course other materials may be used for the body 27.

As illustrated in FIG. 6, many internal passageways within the manifold assembly 10 are shared between components. An interface between connecting passageways in different parts conventionally employs recesses in the mating surfaces to accommodate an o-ring or other sealing device 900 (FIG. 9). The recesses and associated seals increase the likelihood of forming a dead zone at the interface. It is advantageous to have fewer recessed or embedded seals, o-rings, and any resulting dead zones along the flow paths between the central bore 28 of the manifold assembly 10 and the reactant and inert gas valves. Such dead zones would provide gaps or voids which inhibit complete purge of the flow paths. An incompletely purged first reactant gas may undesirably react with a second reactant gas at the site of the void or at a location along the flow path to which the first reactant can diffuse.

It has been found that by reducing the number of intermediary interfaces located between the body 27 and the valves 30, 31, the number of seals is reduced along with the susceptibility for forming dead zones. Where interfaces must occur, advanced fabrication techniques may be utilized to minimize the formation of dead zones at the interfaces. These fabrication techniques include electron beam welding, employing metal seal technology, explosion bonding, and the like. One or more of these techniques may be used to manufacture the manifold assembly 10.

In this preferred embodiment, one or more members are sandwiched between the body 27 and the valves 31(a), 30(a). In the illustrated embodiment, an aluminum base plate 606 and a stainless steel cap 608 connect the body 27 to the valves 30(a), 31(a). The base plate 606 and cap 608 further connect to each other. Preferably, the base plate 606 and cap 608 are connected together before being connected to the body 27. In certain embodiments, the base plate 606 and the cap 608 are attached together using an explosion bonding technique known in the art. Explosion bonding fuses the dissimilar materials of the base plate 606 and cap 608 to provide a seal-free interface therebetween.

Preferably, the base plate 606 is made from the same material as the body 27 to simplify their attachment to each other. In this exemplary embodiment, both are made from aluminum. Before attaching an assembly of the base plate 606 and cap 608 to the body 27, the internal inert gas channel 610 is machined in the body 27. A surface of the base plate 606 forms an outer surface of the internal inert gas channel 610. The illustrated shape and size of the internal inert gas channel 610 is only exemplary and may have a different shape and size. Further, the location of the internal inert gas channel 610 is only exemplary and may be moved from the illustrated location within the body 27.

The explosion bonded base plate 606 and cap 608 are attached to the outer surface of the body 27. An energy beam welding method may be employed to attach the base plate 606 to the body 27. For example, a laser beam or electron beam may be used and provide a highly focused beam of energy to weld the materials together. In certain embodiments, the base plate 606 is electron beam welded to the body 27.

The valves are then connected to the cap 608. In certain embodiments, a metal seal is employed to form a seal between the valves 30, 31 and the cap 608. Metal seals, as opposed to polymeric o-rings, have increased chemical resistance. In certain embodiments, a W-shaped metal seal is employed at the interface between the valves 30, 31 and the cap 608. Metals seals are also advantageous due to their ability to withstand higher loads without excessively deforming as compared to polymeric o-rings. The metal seal may be coated or not.

Once assembled, the inert gas flows from the internal inert gas channel 610 and through line 646 before reaching inert gas valve 30(*a*). Advantageously, the bond between the body 27 and the base plate 606 is an electron beam weld having no separate seals. The bond between the base plate 606 and the cap 608 is an explosion bond having no separate seals. A releasable metal seal is employed between the valves 30(*a*), 31(*a*) and the cap 608 allowing removal of the valves 30(*a*), 31(*a*) for inspection, cleaning, and maintenance.

The inert gas valve 30(*a*) output port is in flow communication with reactant gas valve 31(*a*) via line 648. Line 648 is preferably not shared among components of the internal inert gas channel 610 and requires no seals besides at the inlet and outlet for the line 648. Preferably, the seals sealing the exit from line 646, the inlet to line 648, the outlet from line 648, the exit from line 622, and the inlet to line 624 are metal. Advantageously, the use of metal seals can increase the seal life over conventional polymeric seals and enhance contamination exclusion due to their high chemical resistance.

Reactant gas valve 31(*a*) is in flow communication with line 648. In addition to allowing or preventing reactant gas A from reaching the central bore 28 of the manifold assembly 10 from line 622, the reactant gas valve 31(*a*) is further configured to allow or prevent flow of inert gas through line 624 and into the central bore 28 of the manifold assembly 10. Thus, the reactant gas valve 31(*a*) may be configured to separately allow or prevent the inert gas and the reactant gas A from entering line 624.

In a preferred embodiment, reactant gas valve 31(*a*) is a three port valve. A first port of reactant gas valve 31(*a*) is in flow communication with line 622 and receives reactant gas A. A second port of reactant gas valve 31(*a*) is in flow communication with line 648 and receives an inert gas. A third or exit port for reactant gas valve 31(*a*) is in flow communication with the central bore 28 of the manifold assembly 10 via line 624.

Controlling the machining tolerances of the base plate 606 and cap 608 can aid in aligning a first portion of a line on a first side of an interface with a second portion of that same line on a second side of the same interface thereby reducing recirculation or voids within the manifold assembly 10. Controlling the surface finish and flatness on the mating surfaces of the sub-components of the manifold assembly 10 can aid in sealing adjacent sub-components. In certain embodiments, a 16 to 32 micro finish surface is maintained on the sealing surfaces.

The control system controls one or more of the valves 30, 31 to selectively allow or prevent one or more gases from reaching the central bore 28 of the manifold assembly 10. Advantageously, the embodiments of the manifold assembly 10 reduce the need for conventional seals at interfaces between components of the manifold assembly 10. Reducing the number of conventional seals decreases the chance of forming dead legs or zones. For ALD operation, reducing dead legs reduces the duration of purging needed to avoid interaction of reactants upstream of the reaction space. Such interaction could lead to contamination or non-uniformities in the deposition on substrates. Where interfaces must occur, advanced fabrication techniques may be employed to minimize the formation of dead zones. These fabrication techniques include electron beam welding, employing metal seal technology, explosion bonding, and the like. The manifold assembly 10 further employs discrete heaters 180 to individually control the temperature of the various gases entering the central bore 28 of the manifold assembly 10.

Although the present invention has been described in terms of a certain preferred embodiments, other embodiments apparent to those of ordinary skill in the art also are within the scope of this invention. Thus, various changes and modifications may be made without departing from the spirit and scope of the invention. For instance, various components may be repositioned as desired. Moreover, not all of the features, aspects and advantages are necessarily required to practice the present invention.

What is claimed is:

1. An atomic layer deposition (ALD) device, comprising:
    a dispersion assembly configured to disperse gas;
    an inlet manifold block mounted over the dispersion assembly and having a bore, an internal inert gas channel, a first internal reactant line, and a second internal reactant line, the first and second internal reactant lines being in flow communication with the bore;
    a first reactant valve mounted on the inlet manifold block and configured to control a supply of a first reactant gas to the first internal reactant line;
    a first inert gas valve mounted on the inlet manifold block and configured to control a supply of an inert gas from the internal inert gas channel to the first reactant valve;
    a second reactant valve coupled to the inlet manifold block and configured to control a supply of a second reactant gas to the second internal reactant line; and
    a second inert gas valve mounted on the inlet manifold block and configured to control a supply of the inert gas from the internal inert gas channel to the second reactant valve.

2. The ALD device of claim 1 further comprising a controller configured to control the first reactant valve and the second reactant valve.

3. The ALD device of claim 1, wherein the controller alternates the supply of the first reactant gas and the second reactant gas to the bore.

4. The ALD device of claim 1, wherein the dispersion assembly comprises a showerhead assembly having an exhaust passage.

5. The ALD device of claim 1 further comprising a spacer block, the spacer block being disposed between the first reactant valve and the inlet manifold block.

6. The ALD device of claim 5, wherein the spacer block comprises a base plate and a cap.

7. The ALD device of claim 1 further comprising a spacer block, the spacer block being disposed between the first inert gas valve and the inlet manifold block.

8. The ALD device of claim 1, wherein the distance between the first reactant valve and the inlet manifold block is about 10 mm.

9. The ALD device of claim 8, wherein the first internal reactant line is angled relative to a centerline through the conically shaped bore so as to promote swirling of the first reactant gas in the bore.

10. The ALD device of claim 1, wherein at least a portion of the bore has a conical shape.

11. The ALD device of claim 1, wherein the first internal reactant line has no o-rings between the first reactant valve and the inlet manifold block.

12. The ALD device of claim 1, wherein the first and second reactant valves and the first and second inert gas valves are rated for operation at a temperature of at least 200° C.

* * * * *